(12) United States Patent
Tellkamp

(10) Patent No.: US 6,946,856 B1
(45) Date of Patent: Sep. 20, 2005

(54) THERMAL TESTING METHOD FOR INTEGRATED CIRCUIT CHIPS AND PACKAGES

(75) Inventor: John Paul Tellkamp, Denison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/875,340

(22) Filed: Jun. 24, 2004

(51) Int. Cl.[7] ............................................. G01R 31/02
(52) U.S. Cl. ...................................... 324/750; 324/760
(58) Field of Search ............................... 324/750–755, 324/760, 765–767, 158.1; 438/106, 123, 438/617; 257/673, 690, 692; 228/8, 13, 264

(56) References Cited

U.S. PATENT DOCUMENTS

| | | | | |
|---|---|---|---|---|
| 5,521,511 A | * | 5/1996 | Lanzi et al. ................. | 324/522 |
| 6,294,923 B1 | * | 9/2001 | Blish et al. .................. | 324/765 |
| 6,415,975 B1 | * | 7/2002 | Vijchulata et al. .......... | 228/264 |
| 6,531,336 B1 | * | 3/2003 | Mikami ....................... | 438/106 |
| 6,774,466 B1 | * | 8/2004 | Kajiwara et al. ............ | 257/673 |

* cited by examiner

Primary Examiner—Minh N. Tang
(74) Attorney, Agent, or Firm—Yingsheng Tung; Wade James Brady, III; Frederick J. Telecky, Jr.

(57) ABSTRACT

A method of thermally testing for whether an integrated circuit die is attached to a die pad, is provided. Heat is applied from an external heat source to a first side of the die pad. The die is attached to a second side of the die pad. The second side of the die pad is opposite the first side of the die pad. A temperature of the die is measured at a first die location on the die. The die pad is located between the external heat source and the first die location. This method may be performed using a thermal test apparatus having a socket and the external heat source. The socket is adapted to receive and retain one or more leads of a die package. The apparatus may further include a mechanism adapted to move the heat source toward the first side of the die pad.

22 Claims, 1 Drawing Sheet

THERMAL TESTING METHOD FOR INTEGRATED CIRCUIT CHIPS AND PACKAGES

TECHNICAL FIELD

The present invention relates generally to thermal testing of integrated circuit chips and packages. In one aspect it relates more particularly to thermally testing a die attachment to a die pad or a lead frame.

BACKGROUND

Heat dissipation from an integrated circuit (IC) die or chip during operation is typically an important issue, especially as the density of IC devices on a die continues to increase. Also, many devices now have combinations of high-power transistors and low-power transistors formed on a same die. Such high-power transistors tend to produce more heat than low-power transistors. Further, more system-on-chip configurations are being used. Thus, there are often a wide variety of IC devices on a same die. Some of the IC devices can handle and/or put out much more heat than nearby or neighboring devices on the same die. Hence, the reliability and effectiveness of heat dissipation for a packaged IC chip may greatly affect the reliability and/or performance of an IC chip during operation.

FIG. 1 shows a cross-section view of a typical die package 20 attached to a printed circuit board 22. Many IC chips 24 are housed in a package 20 having a die pad 26 (or die paddle) with an exposed side 28 (i.e., side 28 of the die pad 26 not being covered by the package plastic 30), as shown in FIG. 1 for example. Often a die pad 26 is an integral part of the lead frame structure (see e.g., lead frame 32 in FIG. 1). Generally, a die pad also may include any component that provides a thermal extension of the die pad 26 (e.g., a heat spreader or a slug). In such packaging configurations having an exposed die pad 26, the die 24 is usually adhered directly to the die pad 26 (see e.g., FIG. 1). An exposed die pad 26 is sometimes adhered to a printed circuit board (PCB) 22 to dissipate heat to the PCB 22 (see e.g., FIG. 1). Having the die 24 adhered to the die pad 26 increases the amount of heat transferred from the die 24 to the die pad 26. When a die 24 is not properly adhered to a die pad 26 or when part or all of the die 24 is not adhered to the die pad 26, the amount of heat transferred to the die pad 26 may be significantly reduced and less efficient. This is especially true when the die pad 26 is intended to be along the primary thermal path for heat dissipation from the die 24.

Thermal tests may be performed to determine whether the heat from a die 24 is being dissipated efficiently or sufficiently. In a package configuration where the die pad 26 is one of the primary heat sinks for transferring heat from a die 24 (see e.g., FIG. 1), the results of a thermal test may indicate whether a die 24 is sufficiently adhered to the die pad 26. In the past, thermal-impedance tests were performed by generating heat with the circuitry of the die 24. For example, a K-factor die or a production die that has high-power devices (e.g., motor drivers) was used to generate heat on the die 24. K-factor dies are typically used specifically for testing, and often include temperature sensing elements and resistor networks that cover most of the die surface. In production dies, the temperature of the die 24 may be derived from measuring the leakage of any parasitic diode or other silicon-based IC device because the leakage often has a linear relationship to the temperature of the die 24. Hence, certain output pins may be used as temperature sensors based upon the inherent behavior of the devices as temperature varies.

In these prior thermal testing methods (using a production die or a special testing die), the heat is generated on the die surface by internal components formed in the die 24 and the temperature is sensed (directly or indirectly) by internal components of the die 24, which are essentially at the same location (i.e., on the die 24). Using such tests, the die 24 is often driven with a relatively high power to generate enough heat for the test. Then, the amount of heat remaining on the die surface is used as an indication of the amount of heat dissipated from the die 24; presumably via the die pad 26 as a primary thermal path for some cases. However, there are many possible heat paths for dissipating heat from the die 24, other than via the die pad 26 (e.g., through leads 32, through package plastic 30). Thus, such prior testing methods may not accurately test the heat path between the die 24 and the die pad 26.

SUMMARY OF THE INVENTION

The problems and needs outlined above may be addressed by embodiments of the present invention. In accordance with one aspect of the present invention, a method of thermally testing for whether an integrated circuit die is attached to a die pad, is provided. This method includes the following steps described in this paragraph. The order of the steps may vary, may be sequential, may overlap, may be in parallel, and combinations thereof. Heat is applied from an external heat source to a first side of the die pad. The die is attached to a second side of the die pad. The second side of the die pad is opposite the first side of the die pad. A temperature of the die is measured at a first die location on the die. The die pad is located between the external heat source and the first die location.

This paragraph describes some variations or alternatives for the method described in the immediately preceding paragraph, any of which may be applied in any suitable combination. The applying of heat may be by touching the first side of the die pad with a heated object, shining a laser beam on the first side of the die pad, bringing a heated object proximate to the first side of the die pad, or combinations thereof. The external heat source may be a resistive heater, and the applying of heat may include generating heat in the resistive heater using electricity. The resistive heater may be in physical contact with the first side of the die pad. The applying of heat may be performed intermittently. The measuring of temperature may be performed by measuring a leakage of current in a parasitic capacitor on the die. The measuring of temperature may be performed by measuring a change in impedance of a device on the die. The measuring of temperature may be performed by measuring a change in a property of a device that is part of an integrated circuit on the die. The die may be a production die. The die may be a test die.

In accordance with another aspect of the present invention, a method of thermally testing for whether an integrated circuit die is attached to a die pad, is provided. This method includes the following steps described in this paragraph. The order of the steps may vary, may be sequential, may overlap, may be in parallel, and combinations thereof. Heat from an external heat source is applied to a first die pad location on a first side of the die pad. The die is attached to a second side of the die pad. The second side of the die pad being opposite the first side of the die pad. A first temperature of the die is measured at a first die location on the die resulting from the applying heat to the first die pad location. The die pad is located between the external heat source and the first die location. Heat from the external heat source is applied to a second die pad location on the first side of the die pad. A second temperature of the die is measured at a second die location on the die resulting from the applying heat to the second die pad location. The die pad is located between the external heat source and the second die location. The second die location may be the same as or different from the first die location. The second die pad location may be the same as or different from the first die pad location.

In accordance with another aspect of the present invention, a thermal testing apparatus is provided, which includes a socket and a heat source. The socket is adapted to receive and retain one or more leads of a die package. The die package further includes a die and a die pad. The die pad has a first side and a second side. The first side of the die pad faces an opposite direction than the second side of the die pad. The die is attached to a second side of the die pad. The heat source is distinct and external relative to the die package. The heat source is adapted to apply heat to a first side of the die pad while the lead(s) of the die package are retained by the socket. The heat source may be an object adapted to be heated during use of the apparatus, for example. The apparatus may further include a mechanism adapted to move the heat source toward the first side of the die pad. The heat source may be a laser emitter device. The heat source may be a resistive heater adapted to generate heat using a resistance to electricity.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Figure 1:
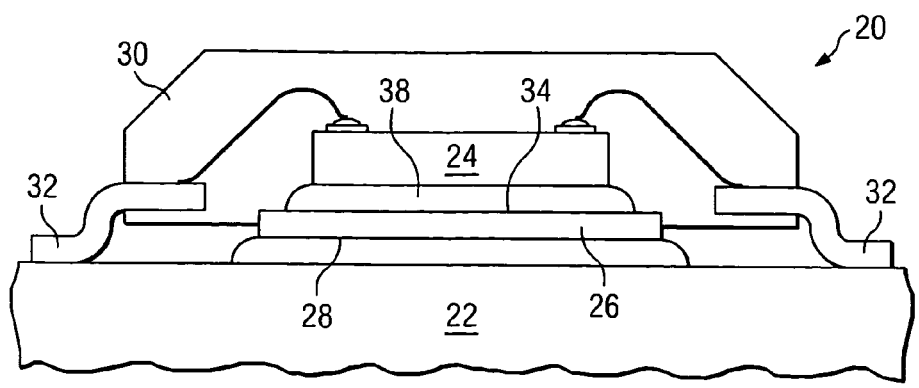
FIG. 1 is a cross-section view of a typical die package attached to a printed circuit board.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Thermal testing of a packaged IC chip is often performed for package characterization. For example, a new package configuration and/or new package materials (e.g., mold compound, lead frame) may be tested to determine heat dissipation and/or other characteristics of a package. Often such tests are performed with test dies to determine how much heat may be dissipated from a package. This information may then be used to determine which production dies may be used with the tested package.

Sometimes, however, it is desirable to test a production part that has been returned by a customer to determine the source of failure. Many production parts cannot dissipate enough power on the die to get a meaningful measurement to evaluate the die attach interface. Because some devices are low power devices (e.g., CMOS logic devices), there may be no way to drive it at the power level needed to develop a desired temperature on the die surface for performing a prior thermal test. Also, sometimes a returned part is not functioning electrically or there is a question about the electrical functionality, which may preclude generating heat on the die surface using the IC circuitry on the die.

As discussed briefly above regarding FIG. 1, some IC chip packages 20 have a die pad 26 with one of its sides 28 exposed. In such packages 20, the die pad 26 may be used as a primary heat transfer path from a die 24 to a PCB 22, another heat sink, and/or the surrounding environment, during operation of the IC chip 24.

In prior thermal testing methods (e.g., thermal-impedance test), heating the packaged die 24 is performed by internally heating the die 24 using circuits or devices formed on the die 24, and the temperature measuring is performed on the surface of the die 24. Measuring how hot the die surface gets with a given amount of power may indicate how much heat is dissipated to the PCB 22. But in such tests, the heat is measured at the same surface where the heat is generated, even though the heat path of interest is typically from the die 24 to the PCB 22 via the die pad 26. It is often desirable to know about the adhesion or die attach interface between the die 24 and die pad 26 when the die pad 26 is intended to be a primary heat sink for the die 24. In such prior tests, it often takes a relatively large amount of power going through the circuitry of the die 24 to generate enough heat to effectively measure the heat transfer at the interface between the die 24 and the die pad 26.

Other tests may use an acoustic test to evaluate the die attach interface using acoustic transmission (assuming that the acoustic transmission correlates with thermal transmission). It is often preferred to perform a thermal transmission test when the interest is in the thermal dissipation performance from the die 24 through the die pad 26.

Figure 2:
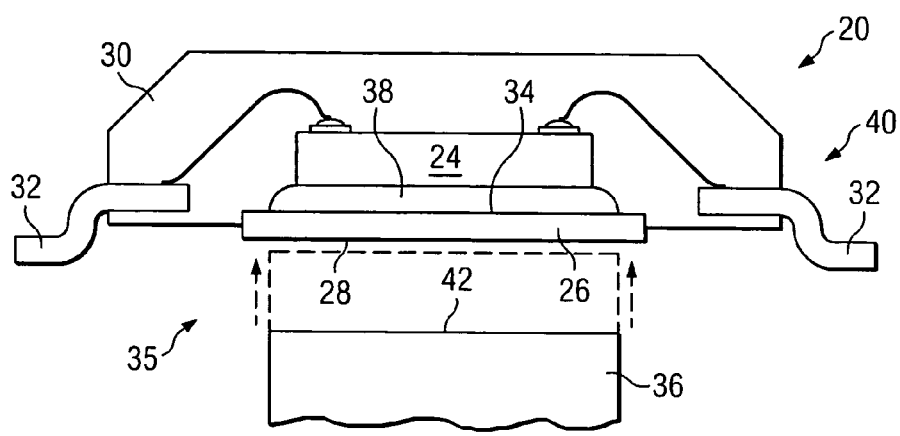
FIG. 2 is a cross-section view of a die package being tested using a method and apparatus of a first illustrative embodiment of the present invention.
Figure 3:
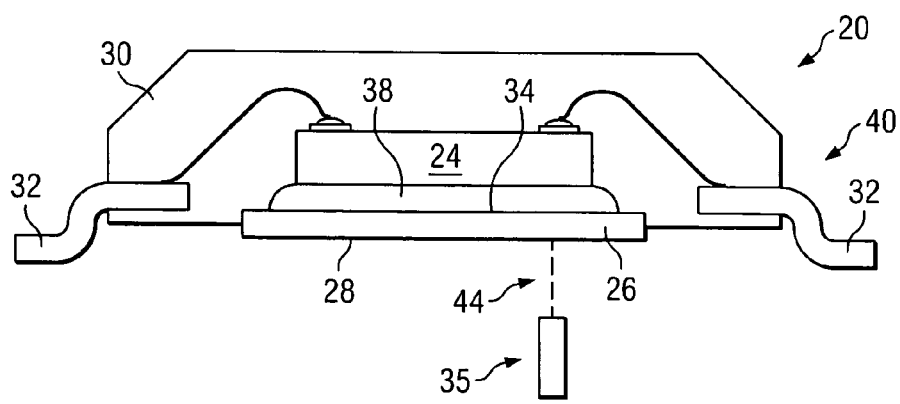
FIG. 3 is a cross-section view of a die package being tested using a method and apparatus of a second illustrative embodiment of the present invention.
Figure 4:
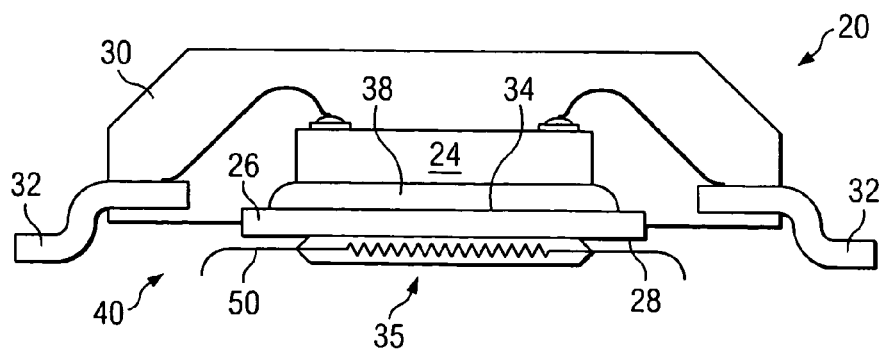
FIG. 4 is a cross-section view of a die package being tested using a method and apparatus of a third illustrative embodiment of the present invention.

Generally, an embodiment of the present invention provides a method of thermally testing for whether an integrated circuit chip or die is attached to a die pad using an external heat source. Illustrative embodiments of the present invention are shown in FIGS. 2–4, in cross-section views. In a preferred embodiment of the present invention, heat is applied to a first side 28 of the die pad 26 (e.g., exposed side of the die pad 26), where the die 24 is attached to a second side 34 of the die pad 26 (the second side 34 being opposite the first side 28 of the die pad 26). The external heat source 35 used to apply the heat to the first side 28 of the die pad 26 may vary for embodiments of the present invention, and the external heat source 35 may be any suitable way of generating heat on the first side 28 of the die pad 26. Preferably, the temperature measurements are derived from measuring leakage(s) of any parasitic diode or other temperature affected structure or devices (e.g., silicon-based IC devices, resistance in metal wire) on the die 24 (as in prior methods). However, other ways of obtaining temperature measurements of the die 24 may be used as well in an embodiment of the present invention.

Thus, by applying heat to the first side 28 of the die pad 26 and measuring the temperature on the die surface, the die attachment interface 38 and the die pad 26 are located along the thermal path between the external heat source 35 and the measurement location (e.g., on die 24). This provides a much more accurate thermal indication about whether the die 24 is sufficiently attached to the die pad 26 than prior methods. It is a more direct method of measuring the heat flow through the die attachment interface 38 because the die attachment interface 38 is directly along the thermal path between the heat source and the measurement location. Also, using a method of testing of the present invention requires much less power and heat to obtain sensitive and meaningful measurements of the die attachment interface 38 than prior thermal methods discussed above.

In a first embodiment of the present invention, the external heat source 35 is a heated object 36 or heated mass. As illustrated in FIG. 2, the heat may be applied to the first side 28 of the die pad 26 by touching the heated object 36 to the first side 28 of the die 24. Alternatively, the heated object 36 may not actually touch or physically contact the first side 28 of the die pad 26 during a thermal test. It may be sufficient to place the heated object 36 near or proximate to the first side 28 of the die pad 26. Also, it may not be practical or possible to touch the heated object 36 to the first side 28 of the die pad 26 in some cases. As yet another alternative, one or more intermediate materials (not shown) may be placed between the heated object 36 and the first side 28 of the die pad 26. In such case, the heated object 36 may press against the first side of the die pad 26 with the intermediate material(s) located there between.

The heated object 36 may be made from any of a variety of suitable materials, including (but not limited to): metal, ceramic, and combinations thereof, for example. Also, the size and shape of the heated object 36 may vary to provide a suitable shape and configuration for testing one, several, or many package configurations. The heated object 36 may be heated by any suitable source of energy, including (but not limited to): fuel, electricity, steam, fluid, and combinations thereof, for example.

In a preferred thermal testing machine 40 for a first embodiment, the thermal testing machine 40 may include sockets (not shown) adapted to receive and retain one or more leads 32 of a die package 20. The sockets may be electrically connected to appropriate leads 32 of a die package 20 for obtaining leakage measurements from the IC devices therein, for example, while also retaining the die package 20 during testing. In such case the thermal testing machine 40 may be adapted to move the heated object 36 towards the first side 28 of the die pad 26 (see e.g., FIG. 2). It may be preferred to apply heat continuously for a period of time or intermittently (at regular or irregular intervals).

In the first embodiment illustrated in FIG. 2, the heating area where the tip 42 of the heated object 36 touches or comes close to the first side 28 of the die pad 26 is about the same as the die-to-die pad interface area. In a variation of the first embodiment (not shown), the tip 42 of the heated object 36 may have a smaller heating area. For example, the tip 42 of the heated object 36 may have a heating area that is much smaller (e.g., about 5–25%) than the die-to-die pad interface area. In such cases, the heated object 36 may provide localized heating of the first side 28 of the die pad 26. The application location of the heating may be moved or scanned across the first side 28 of the die pad 26 (in any suitable pattern) to map out delamination regions for the die attachment interface 38, for example.

In a second embodiment of the present invention, a beam 44 of light (e.g., laser) or heat may be projected onto the first side 28 of the die pad 26 for the heating, as illustrated in FIG. 3. The beam 44 of light or heat may have any suitable beam cross-section area. For beam cross-section areas that are much smaller than the die pad 26 (see e.g., FIG. 3), the beam 44 may be moved or scanned about the die pad 26 (in any suitable pattern) for testing the entire die attach interface 38. For some packages, there may be one or a few known locations where delamination is more likely to occur. In such cases, it may be sufficient to test one or a few locations on the die pad 26 to assess the die attachment interface 38. An advantage of using a laser is that the heat may be pulsed or applied intermittently with more precision than applying a heated object 36. Applying heat with a laser or a focused beam of heat also may allow a large temperature differential, relatively quickly. Such heating and rapid changes in temperature differential may be used to cycle or intermittently heat the die pad 26. This may provide for transient or dynamic temperature measurements. However, an advantage of a heated object 36 is that it may be easier to apply heat uniformly or substantially uniformly across the entire surface of or a majority of the first side 28 of the die pad 26. The heated object 36 may also be used to provide dynamic or impulse testing (e.g., intermittently touching the die pad 26 with the heated object 36).

Advantages of performing a thermal test with heat applied dynamically or intermittently is that the test may be performed more quickly and/or more accurately by observing the transient or dynamic heating. Also, by applying the heat momentarily rather than for a long period of time, larger temperature differentials may be obtained and larger heat power applied for a short period of time without damaging the components inside the packaged chip. A larger temperature differential may allow for more accurate measurements and inspection.

A third embodiment of the present invention is illustrated in FIG. 4. In a third embodiment of the present invention, a resistive heating element 50 may be applied to or place near the first side 28 of the die pad 26.

An embodiment or method of the present invention is advantageous for exposed die pad packages. However, an embodiment or method of the present invention may also be used to thermally test a package (not shown) where the first side 28 of the die pad 26 is not exposed. Hence, a layer of package plastic 30 may be located between the external heat source 35 and the first side 28 of the die pad 26 in such case, for example. However, in such packages where die pad 26 is enclosed in plastic, the primary heat dissipation path is typically through the leads 32. Thus, the external heat source 35 may be applied to the leads 32 rather than the first side 28 of the die pad 26 in such cases to provide a more direct thermal path for testing (as another alternative embodiment).

Still another advantage of a method or embodiment of the present invention is that any or most all production chips may be tested. Production chips may be tested prior to completing the packaging (e.g., not encapsulated in plastic 30 yet) or after completing the package 20, and prior to shipping the product. For example, a thermal test method of the present invention may be used for quality control testing during production. If the thermal test is a dynamic test, the die pad 26 may be heated for a short duration (e.g., a few milliseconds) or until the heat is detected to know whether there is delamination between the die 24 and the die pad 26. By heating the die pad 26 for only a short period of time, it is unlikely to damage the circuitry on the die 24. In a method of the present invention, the heat may be applied until a certain temperature is measured. Then, the length of time that the heat was applied may be used as an indication about whether there is delamination. Hence, a short heat-up time would mean that the thermal path between the first side 28 of the die pad 26 and the die 24 is good, which would indicate that there is probably no delamination. Whereas, a longer heat-up time would indicate a poor thermal path between the first side 28 of the die pad 26 and the die 24, which may be due to delamination at the die attachment interface 38. If a certain heat level is not detected within a predetermined period of time, the heat may be discontinued to prevent damage to the circuitry on the die 24. Also, as a dynamic test, cool-down time performance may be used as a measurement index. The rate of temperature change (positive and/or negative) indicates the thermal capacity of the measurement point with respect to the heat source.

Another advantage of a thermal testing method of the present invention is that it is faster than prior thermal testing methods. Yet another advantage for an embodiment of the present invention may be that a die attachment interface 38 may be thermally tested without exceeding 100 degrees Celsius in the die 24. In prior thermal testing methods where the heat was generated using components on the die 24, often the temperature of the die 24 would exceed 100 degrees Celsius to provide a great enough temperature differential at the die attachment interface 38 for getting a meaningful measurement. But in generating such high temperatures on the die 24, it often generates failures in the device or the thermal path under evaluation (e.g., die attachment interface 38) while trying to obtain measurements. Sometimes exceeding 100 degrees Celsius in the die 24 causes trapped water vapor or air to burst or break chip components or layers to relieve the pressure, which causes damage to the die 24.

Using an external heat source 35 in accordance with an embodiment of the present invention, the heat source may be much greater than 100 degrees Celsius while still providing a large temperature differential across the die attachment interface 38 and while not exceeding 100 degrees Celsius inside the package 20. The highest temperature is located on the outside and at the die pad 26 rather than inside the die 24 during thermal testing using an embodiment of the present invention. Thus, a more sensitive thermal test may be performed across the die attachment interface 38 without introducing internal damage to the die 24.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of thermally testing an integrated circuit die attached to a die pad, the method comprising:
    applying heat from an external heat source to a first side of the die pad, wherein the die is attached to a second side of the die pad, the second side of the die pad being opposite the first side of the die pad; and
    measuring a temperature of the die at a first die location on the die, wherein the die pad is located between the external heat source and the first die location.

2. The method of claim 1, wherein the applying heat comprises touching the first side of the die pad with a heated object.

3. The method of claim 1, wherein the applying heat comprises shining a laser beam on the first side of the die pad.

4. The method of claim 1, wherein the applying heat comprises bringing a heated object proximate to the first side of the die pad.

5. The method of claim 1, wherein the external heat source is a resistive heater, and wherein the applying heat comprises generating heat in the resistive heater using electricity.

6. The method of claim 5, wherein the resistive heater is in physical contact with the first side of the die pad.

7. The method of claim 1, wherein the applying heat is performed intermittently.

8. The method of claim 1, wherein the temperature measuring is performed by measuring a leakage of current in a diode on the die.

9. The method of claim 1, wherein the temperature measuring is performed by measuring a change in impedance of a device on the die.

10. The method of claim 1, wherein the temperature measuring is performed by measuring a change in a property of a component on the die.

11. The method of claim 1, wherein the die is a production die.

12. The method of claim 1, wherein the die is a test die.

13. A method of thermally testing an integrated circuit die attached to a die pad, the method comprising:
    applying heat from an external heat source to a first die pad location on a first side of the die pad, wherein the die is attached to a second side of the die pad, the second side of the die pad being opposite the first side of the die pad;
    measuring a first temperature of the die at a first die location on the die resulting from the applying heat to the first die pad location, wherein the die pad is located between the external heat source and the first die location;
    applying heat from the external heat source to a second die pad location on the first side of the die pad; and
    measuring a second temperature of the die at a second die location on the die resulting from the applying heat to the second die pad location, wherein the die pad is located between the external heat source and the second die location.

14. The method of claim 13, wherein the second die location is the same as the first die location.

15. The method of claim 13, wherein the second die location is different from the first die location.

16. The method of claim 13, wherein the second die pad location is the same as the first die pad location.

17. The method of claim 13, wherein the second die pad location is different from the first die pad location.

18. A thermal testing apparatus comprising:

a socket adapted to receive and retain one or more leads of a die package, wherein the die package further comprises a die and a die pad, the die pad having a first side and a second side, the first side of the die pad facing an opposite direction than the second side of the die pad, and wherein the die is attached to the second side of the die pad;

a heat source being distinct and external relative to the die package, the heat source being adapted to apply heat to the first side of the die pad while the leads of the die package are retained by the socket; and a testing apparatus coupled to the die for testing the temperature of the die.

19. The thermal testing apparatus of claim 18, wherein the heat source is an object adapted to be heated during use of the apparatus.

20. The thermal testing apparatus of claim 18, further comprising a mechanism adapted to move the heat source toward the first side of the die pad.

21. The thermal testing apparatus of claim 18, wherein the heat source is a laser emitter device.

22. The thermal testing apparatus of claim 18, wherein the heat source is a resistive heater adapted to generate heat using a resistance to electricity.

* * * * *